United States Patent [19]

Kuhn

[11] 4,314,374
[45] Feb. 2, 1982

[54] HIGH POWER AUDIO FREQUENCY TRANSMITTER

[75] Inventor: John J. Kuhn, Allison Park, Pa.

[73] Assignee: Westinghouse Air Brake Company, Swissvale, Pa.

[21] Appl. No.: 850,177

[22] Filed: Nov. 10, 1977

[51] Int. Cl.³ .............................................. H04B 1/04
[52] U.S. Cl. ...................................... 455/108; 332/38
[58] Field of Search ............... 325/105, 150, 151, 169, 325/181, 182, 184, 186; 332/31 T, 31 R, 38, 43 B, 44, 48, 60, 61, 62; 455/108, 68, 102, 109, 110, 295, 303, 304, 307

[56] References Cited

U.S. PATENT DOCUMENTS

| | | | |
|---|---|---|---|
| 2,282,347 | 5/1942 | Taylor | 455/108 |
| 3,202,940 | 8/1965 | Vietrick | 325/184 |
| 3,335,370 | 8/1967 | Wittig | 325/181 |
| 3,413,570 | 11/1968 | Bruene et al. | 325/182 |
| 3,449,680 | 6/1969 | Schilb | 325/151 |
| 3,506,920 | 4/1970 | Swanson | 455/108 |
| 3,514,690 | 5/1970 | Quiros | 325/186 |
| 3,866,148 | 2/1975 | Lisle, Jr. | 332/31 T |
| 3,898,590 | 8/1975 | Swanson | 332/31 T |
| 4,085,389 | 4/1978 | Kuroda | 325/182 |

Primary Examiner—Jin F. Ng
Assistant Examiner—Tommy P. Chin
Attorney, Agent, or Firm—J. B. Sotak

[57] ABSTRACT

A high power amplitude modulated audio frequency transmitter having a Twin-T low frequency oscillator, a tickler coil high frequency oscillator, a switching regulator and a switching amplifier. The Twin-T low frequency oscillator produces a sine wave modulating signal which is fed to the switching regulator. The tickler coil high frequency oscillator produces a carrier signal which is fed to the input end of the switching amplifier. The output signal of the switching regulator is fed to the output end of the switching amplifier so that a sine wave modulated signal is developed on the output of the switching amplifier.

11 Claims, 4 Drawing Figures

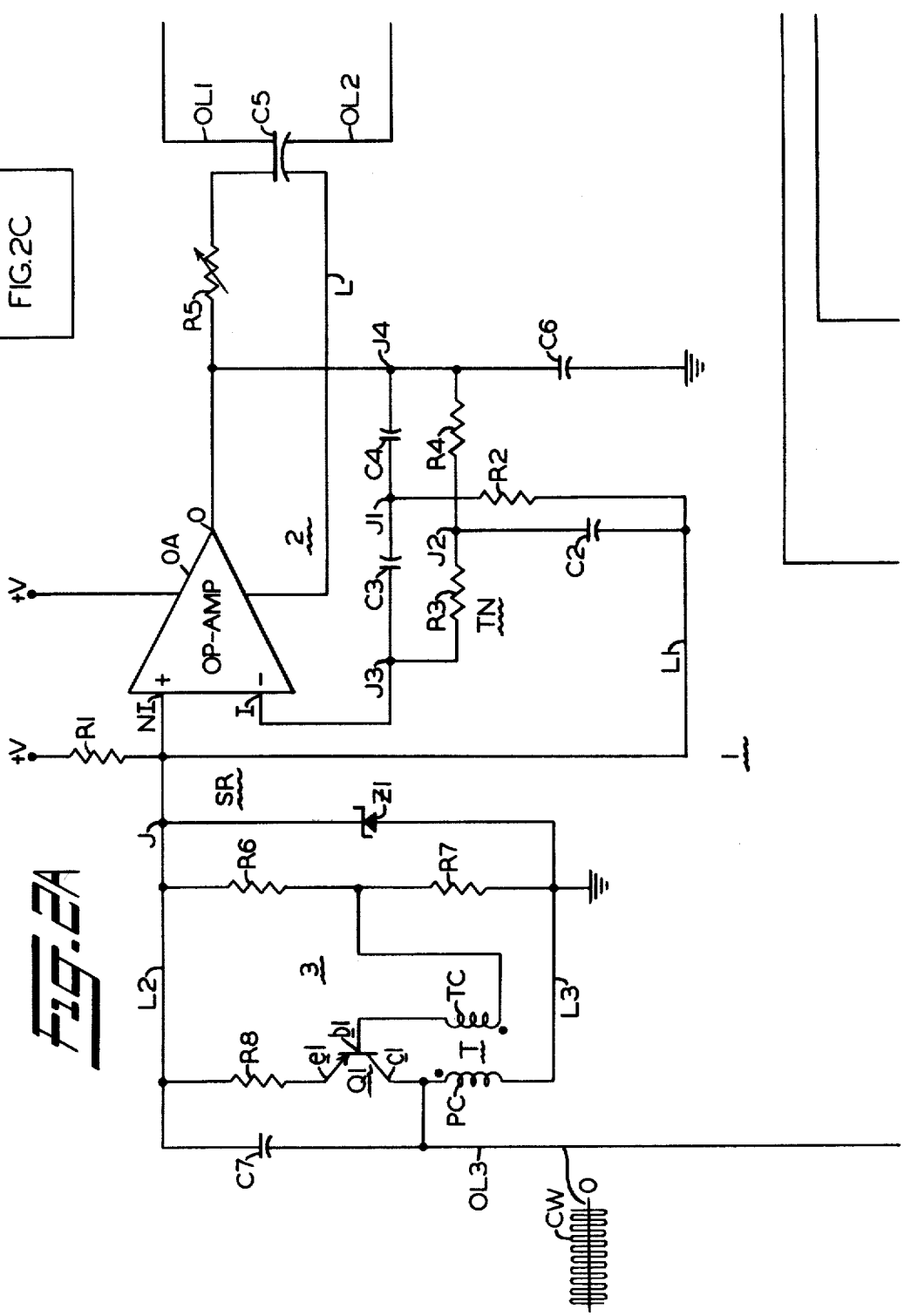

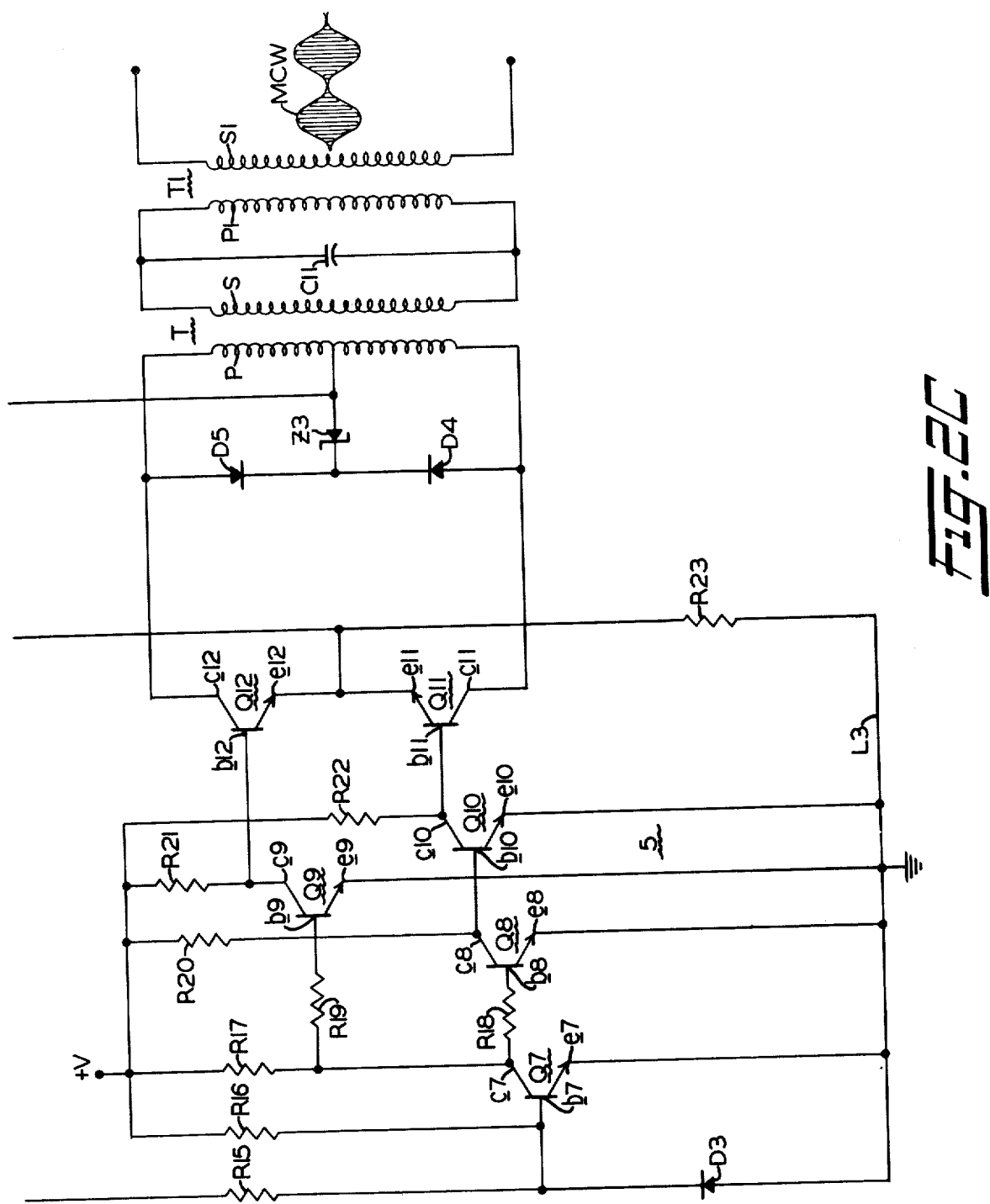

HIGH POWER AUDIO FREQUENCY TRANSMITTER

FIELD OF THE INVENTION

The invention relates to an improved high efficiency and low power consumption audio frequency transmitter and, more particularly, to an electronic transmitting circuit employing a coding oscillator, a carrier frequency oscillator, a switching regulator and a switching power amplifier for producing a sine wave modulated signal for use in a coded signal control system.

BACKGROUND OF THE INVENTION

In certain railway signaling systems, such as, in a broken rail detection system, it is common practice to transmit a sine wave modulated audio frequency signal through the rails to provide protection of trains between head blocks. In such coded carrier track circuits, a transmitter may be connected at one end of a block section to send an encoded signal to a tuned receiver connected to the other end of the block section. The present and chief concern of the subject invention is related to the high power audio frequency transmitters which are utilized in the subject coded signal control system. In the past, the conventional types of audio frequency transmitters were possessed of a number of disadvantages which resulted in inefficient operation. For example, the previous types of high power transmitters consumed an excessive amount of power which necessitated heat sinking and resulted in space and package limitations. Further, existing high power transmitters place an excessive demand on the battery supply voltage source when it is necessary to provide standby power in cases when the primary supply voltage fails. Thus, it would be highly advantageous to improve the efficiency of a high power transmitter so that the power demand is not excessive thereby minimizing the space and package requirements due to the less amount of necessary heat sinking. In addition, an economic advantage is realized due to the reduced power requirements, and the overall cost in manufacturing and installation is materially reduced to the decreased size of a more efficient high power transmitter.

OBJECTS OF THE INVENTION

Accordingly, it is an object of this invention to provide a highly efficient high power electronic transmitter for broken rail protection track circuits.

Another object of this invention is to provide an improved high power transmitter which is extremely efficient in operation.

A further object of this invention is to provide a new electronic transmitting circuit arrangement which materially reduces the power requirements of the voltage source.

Still another object of this invention is to provide a new and improved solid-state high power transmitter circuit which effectively decreases the amount of power demanded of the supply voltage.

Yet another object of this invention is to provide a unique frequency transmitter employing a carrier frequency oscillator, a coding oscillator, a switching regulator and a switching power amplifier for producing a high power modulated output signal.

Still another object of this invention is to provide a transmitter circuit for producing a sine wave modulated output signal comprising, a low frequency oscillator for developing a modulating signal, a high frequency oscillator for developing a carrier signal, the modulating signal coupled to the input of a switching regulator, said switching regulator including a multiple of transmitter control stages for alternately turning on and off an output stage whereby a time varying voltage is produced at the modulating frequency, the carrier signal coupled to the input of a switching amplifier, and the time varying voltage output signal of the switching regulator coupled to the switching amplifier whereby the sine wave modulated output signal is produced across the output of a step-up device.

Still a further object of this invention is to provide a high power audio frequency transmitter for a railway broken rail detection system which is simple in design, economical in cost, durable in use, dependable in service, efficient in operation and reliable in performance.

SUMMARY OF THE INVENTION

In accordance with the present invention, there is provided a highly efficient audio frequency power transmitter for producing a sine wave modulated output signal. The transmitter includes a low frequency modulating oscillating circuit having an operational amplifier which includes an inverting and noninverting input and an output. An RC Twin-T feedback network is coupled between the output and the inverting input and a Zener diode voltage regulating circuit coupled to the noninverting input. A tickler coil type of high frequency carrier oscillating circuit including an L-C tuned amplifying circuit being biased by voltage supplied by the voltage regulating circuit. A switching regulating circuit is coupled to the output of the low frequency oscillating circuit. The switching regulating includes a multiple of transmitter control stages for alternating turning on and off a series pass output transistor stage whereby a time varying voltage is produced at the modulation frequency. A switching amplifier is coupled to the output of the high frequency carrier oscillating circuit. The switching amplifier includes a push-pull transistor output stage and includes three cascaded transistor stages for driving one of the push-pull stages and two cascaded transistor stages for driving the other of the push-pull stages. The push-pull output stage is transformer coupled to a tuned circuit for producing a sine wave modulated output signal. An overload protection circuit deactivates the switching regulator when an overload condition exists and a surge protection circuit including a pair of diodes and Zener diode is coupled to the primary winding of the transformer to prevent damage from high voltage transients.

BRIEF DESCRIPTION OF THE DRAWINGS

Other objects, features and advantages of the invention will become more readily apparent from the following detailed description of the preferred embodiment when read with reference to and considered in conjunction with the accompanying drawings which form a part of this disclosure, in which:

FIG. 1 shows the physical relationships and required alignment of FIGS. 2A, 2B and 2C which is necessary to properly interconnect the various circuits of the high power transmitting circuit of the present invention.

FIGS. 2A, 2B and 2C, when arranged as illustrated in FIG. 1, show the detailed schematic circuit diagram of the preferred embodiment of the highly efficient electronic transmitter of the present invention.

DESCRIPTION OF THE INVENTION

Figure 2B:
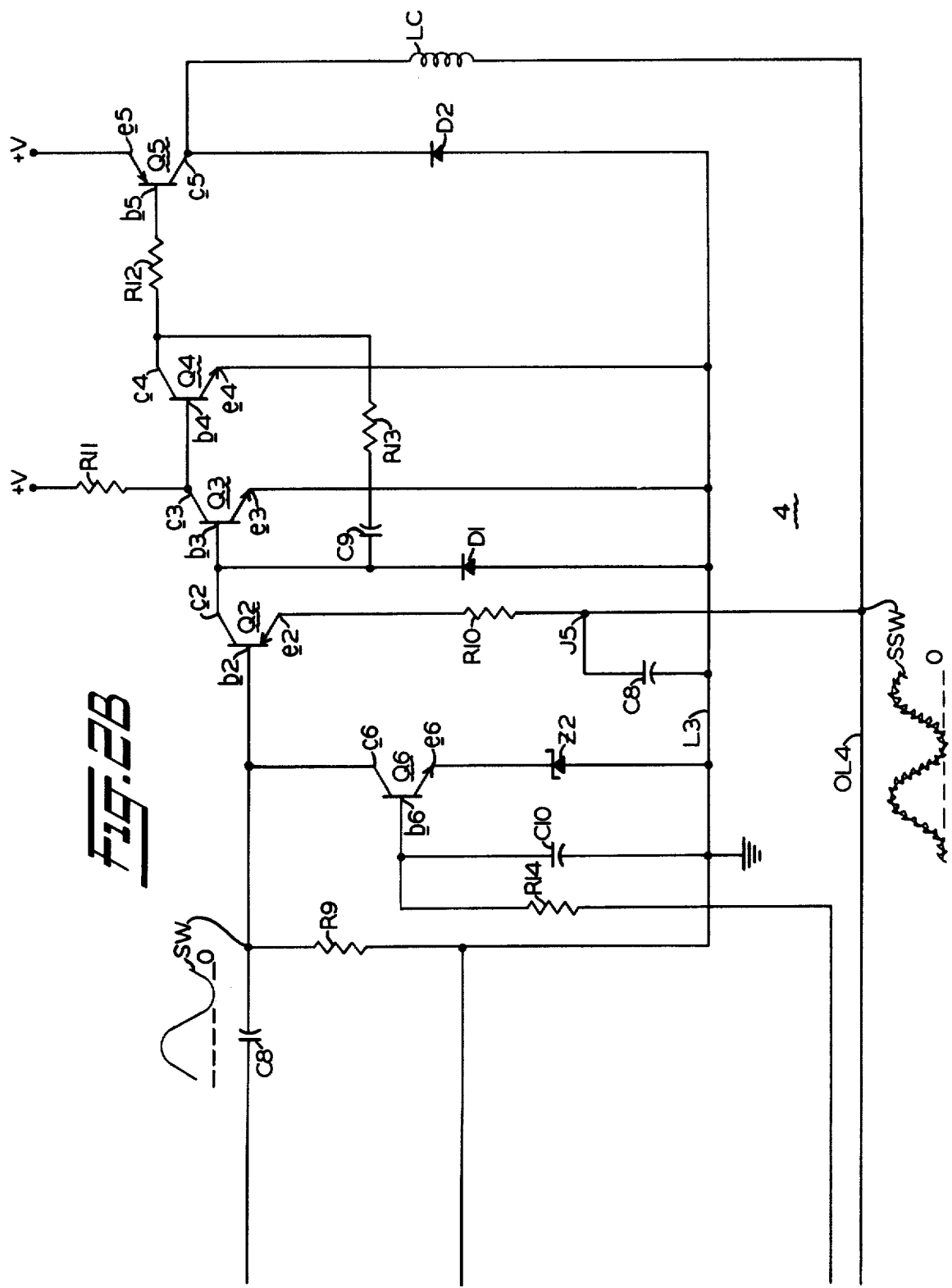

Referring to the drawings and, in particular, to FIG. 2A, when arranged in the manner as shown in FIG. 1, there is shown a vital type of low frequency modulating signal and a high frequency carrier signal oscillating circuit portion serially characterized by numeral 1, of the high power transmitter.

As shown, the vital circuit 1 includes a low frequency modulating signal circuit or code rate oscillator 2, an active gain element, such as, an integrated circuit operational amplifier op-amp 4. The operational amplifier 4 may be of the type manufactured and sold by Fairchild Semiconductor Corporation of Mountainview, Ca., and designated as $\mu$A-741. It will be noted that the operational amplifier 4 includes a pair of input terminals NI and I and a single output terminal O. The integrated circuit operational amplifier 4 may be of the differential input signal type in that it functions on the difference of voltage of the signal levels that appear on the two inputs. As shown, one of the two inputs is termed the noninverting or positive terminal NI while the other of the two inputs is termed the inverting or negative terminal I. It will be appreciated that the noninverting input NI is biased positively by the shunt regulator SR which includes a current-limiting resistor R1 and a voltage breakdown device or Zener diode Z1. As shown, the upper end of resistor R1 is connected to the positive terminal +V of a suitable source of d.c. supply voltage (not shown) while the lower end of resistor R1 is connected to the cathode electrode of Zener diode Z1 is coupled to a suitable reference potential, such as, ground. The noninverting input NI is directly connected to the unction point J formed between resistor R1 and Zener diode Z1 which provides constant voltage over a wide range of current and voltage variations which may occur in the supply source. An appropriate terminal point of the integrated circuit op-amp 4 is connected to the positive terminal +V while another terminal point of the op-amp 4 is connected to ground via lead L as will be described hereinafter. It will be noted that the output terminal O is coupled to the inverting input terminal I via a precision parallel or Twin-T resistance-capacitance network TN which determines the frequency of oscillations of oscillator 2. The Twin-T network TN includes resistors R2, R3 and R4 and capacitors C2, C3 and C4 which form a very sharp notch filter. In practice, the negative feedback supplied to the inverting input I from the output O through the Twin-T network TN cancels the internal positive amplification of the op-amp 4 at all frequencies except the notch frequency. That is, at the preselected frequency, the feedback is regenerative so that oscillations occur at the notch frequency. As shown, resistor R2 and capacitors C3 and C4 form one tee of the network TN while capacitor C2 and resistors R3 and R4 form the other tee of the network TN. In viewing the drawing, it will be seen that the upper end of resistor R2 is connected to the junction point J1 which is common to both capacitors C3 and C4 while the lower end of resistor R2 is connected to lead L1. As shown, the upper plate of capacitor C2 is connected to junction point J2 which is common to both resistors R3 and R4 while the lower plate of capacitor C3 is connected to lead L1. The left-hand plate of capacitor C3 and the left-hand end of resistor R3 are connected together to form junction J3 which is connected to inverting input I of operational amplifier OA. Similarly, the right-hand plate of capacitor C4 and the right-hand end of resistor R4 are connected together to form junction point J4 which is connected to the output O of operational amplifier 4. Thus, a portion of the output signal developed on terminal O is fed back to the inverting input terminal I by the Twin-T network TN. In the instant case, the Twin-T network TN is symmetrical in that the parameters of capacitors C3 and C4 are equal and the resistors R3 and R4 have identical values. Further, in the present case, the parallel-T network TN is unbalanced from the standpoint that the resistive values of resistor R2 are not an integral value of resistors R3 or R4, and the capacitive value of capacitor C2 is not an integral value of capacitors C3 or C4. It will be appreciated that the frequency and gain of the Twin-T network may be varied by changing the circuit parameters of certain selected elements. In practice, the center or notch frequency may be of any one of six selected frequencies which may be from 0.800 to 7.000 hertz. The selected center frequency will unergo a 180 degree phase shift in passing from the input junction J4 to the output junction J3 of the Twin-T network TN. While the Twin-T network TN will pass signals of other frequencies, the network will only provide a phase shift which is less than 180 degrees and may be less than 90 degrees. At zero (0) and infinite frequencies, zero (0) phase shift takes place, while at all other frequencies, the phase angle follows a rising and decaying exponential curve toward and away from ±90 degrees as the frequencies approach and recede from the center frequency. As shown, the output terminal O is coupled by a variable resistor or selectable resistance R5 to one of two leads of the upper plate of a four-terminal capacitor C5. One of the two leads the the lower plates is connnected to lead L which is grounded via the other plate of capacitor C5 as will be described hereinafter. The other lead of the upper plate forms one output line or lead OL1 while the other lead of the lower plate forms a second output line or terminal lead OL2 which supply modulating or code rate signals to a switching regulator as will be described presently. Thus, the output modulating signal developed on the two terminals of the code rate oscillator 2 will be a sine wave having a single selected low frequency and having a substantially constant peak-to-peak value.

Further, as shown in FIG. 2A, a transistorized carrier signal oscillator or generator 3 of the vital circuit 1 is also powered by the shunt regulator SR. It will be seen that the high frequency carrier generator 3 includes a single active amplifying stage consisting of PNP transistor Q1. The transistor Q1 includes a base electrode b1, a collector electrode c1 and an emitter electrode e1. A voltage dividing network including series connected resistors R6 and R7 is connected across the Zener diode Z1. It will be seen that the upper end of resistor R6 is coupled to the positive lead L2 while the lower end of resistor R7 is connected to ground lead L3. The base electrode b1 is coupled to a junction formed between voltage dividing resistors R6 and R7 via a secondary tickler coil TC of transformer T. The emitter electrode e1 is coupled to the positive lead L2 via a biasing resistor R8. The frequency of oscillations of the transistor oscillator is determined by a parallel resonant or tank circiut including the primary winding or output coil PC of transformer T and tuning capacitor C7. As shown, the primary coil PC is connected between collector electrode c1 and ground lead L3 while the capacitor C7 is connected from the collector electrode c1 to ground lead L3 via Zener diode Z1. That is, the a.c. signal path for the capacitor C7 of the tank circuit is completed via lead L2 through the low impedance of the conducting Zener diode Z1 to the ground lead L3. Thus, the carrier signal is incapable of being developed on output line or lead OL3 unless the upper plate of capacitor C7 is connected to ground lead L3 through a low impedance path completd by the conduction of the Zener diode Z1 to form the tuned parallel resonant circuit which is necessary for establishing the oscillating condition of the transistor oscillator 3. Thus, the impedance condition of the resonant circuit path is checked and monitored to ensure that if the voltage on junction point J increases due to a poor solder connection, the carrier signal oscillator 3 will cease producing oscillations so that a circuit failure is inherently and readily ascertainable. That is, the increase impedance caused by the poor solder joint results in a decrease in the quality Q of the tuned resonant circuit so that the gain of the loop decreases and causes cessation of the carrier signal oscillations. Thus, the vitality of the code rate generator and carrier frequency oscillator circuit 1 is maintained to ensure that an unsafe condition does not occur during such a critical circuit or component failure.

Turning now to FIG. 2B of the drawings, there is illustrated a switching regulator 4 which receives and regulates the modulating signals produced by code rate generator 2. As shown, the sine wave signals are connected from line OL1 to the input stage of the switching regulator 4 via coupling capacitor C8 while lead OL2 is coupled to ground lead L3. Thus, the ground connection is completed from lead L3 through the two lower plates of four-terminal capacitor C5 to lead L. The switching regulator includes transistors Q2, Q3, Q4 and Q5 each having a base electrode, a collector electrode and an emitter electrode. As shown, the coupling capacitor C8 references the modulating signal having a sinusoid curve depicted by waveform SW to ground and couples the sine wave signal to the base electrode b2 of the input transistor stage Q2. A voltage dropping resistor R9 is coupled between the base electrode b2 and ground lead L3. The collector electrode c2 is directly connected to the base electrode b3 of the second transistor stage Q3. The emitter electrode e2 is coupled to ground lead L3 via the series connected resistor R10 and capacitor C8 is directly connected to output lead OL3, the purpose of which will be described hereinafter. The base electrode b3 is connected to ground lead L3 via reverse voltage protection diode D1. As shown, the emitter electrode e3 is directly connected to ground lead L3 while the collector electrode c3 is connected to the positive voltage terminal +V via load resistor R11. The collector electrode c3 is also directly connected to the base electrode b4 of the third stage transistor Q4. The emitter electrode c4 is directly connected to ground line L3 while the collector electrode c4 is connected to base electrode b5 of the series pass output transistor stage Q5 through resistor R12. As shown, a portion of the output from the third stage transistor Q4 is fed back to the input of the second transistor stage Q3 via the series connected resistor R13 and capacitor C9. That is, a positive feedback path extends from collector electrode c4 through resistor R13 and capacitor C9 to base electrode b3 to assist in turning the transistor ON and OFF. The emitter electrode e5 is directly connected to the positive voltage terminal +V. The collector electrode c5 is connected to ground line L3 via diode D2 and is also connected to output lead OL4 via an inductor or inductance coil LC. In practice, the switching regulator 4 produces an output signal having a wave form with a slight ripple as illustrated by character SSW wherein switching action of the output transistor Q5 is superimposed upon the sine wave modulating signal.

An overload protection circuit including transistor Q6 having a base electrode b6, a collector electrode c6 and an emitter electrode e6. As shown, the collector electrode c6 is directly connected to the base electrode b2 of transistor Q2 while the emitter electrode e6 is connected by Zener diode Z2 to ground lead L3. The base electrode b6 is connected to ground lead L3 via capacitor C10 and is also connected to the switching amplifier 5 via resistor R14.

As shown, the switching amplifier 5 is a multiple stage modulating circuit in which the carrier frequency signal produced by oscillator 3 is amplitude modulated by the amplified sine wave signal SSW. It will be noted that the carrier frequency signals developed on output lead OL3 are conveyed to the input stage of the switching amplifier. That is, the carrier signals, as illustrated by wave form CW in FIG. 2A are supplied to the input stage including NPN transistor Q7 having a base electrode b7, a collector electrode c7 and an emitter electrode e7. The signal CW on lead OL3 is coupled to the base electrode via current limiting resistor R15. The base electrode b7 is connected to ground lead L3 via a reverse polarity protection diode D3 and is also connected to the positive supply terminal +V via biasing resistor R16. The emitter electrode e7 is directly connected to ground while the collector electrode c7 is connected to positive terminal +V via load resistor R17. The collector electrode c7 is also connected to the input electrodes of transistor stages Q8 and Q9. The NPN transistor Q8 includes a base electrode b8, a collector electrode c8 and an emitter electrode e8 while the NPN transistor Q9 includes a base electrode b9, a collector electrode c9 and an emitter electrode e9. It will be noted that the collector electrode c7 of transistor Q7 is connected to the base electrode b8 via resistor R18 while the collector electrode c7 is also connected to the base electrode b9 via resistor R19. The emitter electrodes e8 and e9 are both directly connected to ground lead L3. The collector electrode c8 is connected by load resistor R20 to the positive voltage terminal +V while the collector electrode c9 is connected by load resistor R21 to the positive potential terminal +V. As shown, the next succeeding stage includes an NPN transistor Q10 having a base electrode b10, a collector electrode c10 and an emitter electrode e10. The output collector electrode c8 is directly connected to the input base electrode b10 while the emitter electrode e10 is directly connected to ground lead L3. The collector electrode is connected to the positive voltage terminal +V via load resistor R22. The active output elements are NPN power transistors Q11 and Q12 which operate as class B amplifier. The transistor Q11 includes a base electrode b11, a collector electrode c11 and an emitter electrode e11 while the transistor Q12 includes a base electrode b12, a collector electrode c12 and an emitter electrode e12. As shown, the collector electrode c10 is directly connected to base electrode b11 of the power amplifying transistor Q11 while the collector electrode c9 is is directly connected to the base electrode b12 of the power amplifying transistor Q12. The emitter electrodes e11 and e12 are coupled in common and are connected to ground lead L3 via resistor R23. As previously mentioned, the overload protection device in transistor Q6 is connected to the switching amplifier 5 and, in fact, is connected to the emitter electrodes e11 and e12 via resistor R14. As shown, the output collector electrodes c11 and c12 are connected to the respective ends of a center-tapped primary winding P1 of transformer T. That is, the collector electrode c11 is connected to the lower end of primary winding P while the collector electrode c12 is connected to the upper end of the primary winding P. A pair of surge suppressing diodes D4 and D5 are connected across the primary winding P to protect the semiconductive components against damage and/or destruction by high voltage transients which may be developed on the track section. As shown, the anode electrode of diode D4 is connected to the lower end of primary winding P while the anode electrode of diode D5 is connected to the upper end of primary winding P. The cathode electrodes of diodes D4 and D5 are connected in common, and a voltage limiting Zener diode Z3 is connected between the junction of diodes D4 and D5 and the center tap of primary winding P which also forms the input terminal for the sine wave modulating signals SSW that are produced on output lead OL4. The secondary winding S of transformer T is connected to a tuned parallel resonant circuit made up of capacitor C11 and primary winding P1 of transformer T1. The amplitude modulated carrier signals developed on primary winding P1 are induced into secondary winding S1 which forms a tuned bond with the parallel resonant circuit. Thus, the amplitude modulated carrier signals MCW produced across secondary winding S1 may be connected to the transmitter end of the track section by suitable conductors and coupling means.

In describing the operation, let us assume that the biasing and supply voltages are applied, that all the components or elements are intact and that the circuits 1 and 4 are functioning properly. Under this condition, it will be seen that both the low frequency oscillator 2 and the high frequency oscillator 3 go into socillation so that a low frequency modulating signal SW is developed on output leads OL1 and OL2 and a high frequency carrier signal CW is developed on output lead OL3. As previously mentioned, the modulating output signals take the form of sine waves having a constant peak-to-peak value and are appropriately fed to the switching regulator circuit 4 of the transmitter of the coded signal control system. The carrier output signals CW may have, for example, one of four audio frequencies, such as 270, 330, 380 or 450 hertz and are fed to the modulator so that a constant amplitude modulated signal is transmitted to the coded track section. As previously mentioned, a potentially hazardous condition may result when a high resistance appears in series with the Zener diode Z1 since the voltage level applied to the noninverting input would increase and would cause an increase in the peak-to-peak amplitude of the sine wave modulating signals developed on output leads OL1 and OL2. However, with the Zener diode placed in the return path for the capacitor C of the tank circuit of the carrier frequency signal oscillator 3, the appearance of a high resistance in series with the Zener diode Z1 will result in the cessation of the oscillations on the output lead OL3 which will result in a safe condition since the modulating signals have no carrier wave. Accordingly, the vitality of the coded signal control system is maintained by the code rate generating and carrier frequency oscillating circuit 1.

As previously mentioned, the sine wave modulating signals produced by oscillator 2 are fed to the input of regulator 4 via the zero referencing capacitor C8. Initially, it will be assumed that transistors Q2 and Q3 are turned off while transistors Q4 and Q5 are turned on due to the absence of charge on capacitor C8 and due to the presence of positive modulating voltage on base electrode b2. Now when potential charge on capacitor C8 causes the voltage on emitter electrode e2 to exceed the instantaneous positive voltage of modulating signal SW, the transistor Q2 is turned on. The conduction of transistor Q2 causes the transistor Q3 to turn on which in turn results in the turning off of transistor Q4. The positive feedback from collector electrode c4 through resistor R13 and capacitor C9 to base electrode b3 ensures that transistor Q3 is fully turned on. The nonconduction of transistor Q4 causes transistor Q5 to turn off so that the capacitor C8 begins to discharge through the load. Now when the potential charge on capacitor C8 becomes less than the instantaneous modulating signal voltage, the transistor Q2 is again rendered nonconductive. The nonconduction of transistor Q2 results in the turning off of transistor Q3 which in turn results in the conduction of transistor Q4. The positive feedback from collector electrode c4 through series resistor R13 and capacitor C9 to base electrode b3 results in the rapid and complete turning off of transistor Q3. The turning on of transistor Q4 again results in the conduction of transistor Q5 which again begins to charge capacitor C8 from the positive voltage terminal +V emitter collector electrodes e5-c5 through inductor LC, through capacitor C8 to ground lead L3. Thus, the transistors Q2, Q3, Q4 and Q5 will be switched on and off in accordance with the charging and discharging of capacitor C8 so that a ripple-like waveshape is superimposed on the sine wave modulating signal as shown by waveform SSW. The rise time of the ripple waveform is determined by the time constant of the charging path while the fall time is determined by the RC value of the load circuit. It wil be appreciated that the transistors operate most efficiently and produce the least amount of heat when they are operated in a switching mode. In practice, the peak-to-peak value of the output signal SSW is substantially identical to the peak-to-peak voltage of the input signal SW and the output signal SSW is fed to the output end of the switching amplifier 5 via lead OL4.

As previously mentioned, the carrier signal waveform CW is conveyed to the input end of switching amplifier 5 via lead OL3. The carrier signals are applied to base electrode b7 of common emitter transistor Q7, and the amplified signals are derived from the collector electrode c7. As shown, the amplified signals from the input stage Q7 are fed to the base electrode b8 as well as to the base electrode b9 of transistors Q8 and Q9, respectively. The carrier signals are again amplified by common emitter stages Q8 and Q9, and the amplified signals from collector electrode c8 are fed to an additional common emitter stage including transistor Q10 which inverts the signals in relation to the signals on collector electrode c9. Thus, the amplified signals developed on collector electrode c10 are 180 degrees out of phase with the amplified signals produced on collector electrode c9. It will be seen that the output stage of the switching amplifier modulator 5 includes two power transistors Q11 and Q12 which are adapted to operate as a push pull class B amplifier. Let us assume that a positive alternation of the carrier frequency signal appears on the base electrode b11 of transistor Q11 so that at the same time a negative alternation of the carrier frequency signal is present on the base electrode b12 of transistor Q12 due to the phase inversion. Under this condition, an amplified carrier frequency alternation is developed on the output collector electrode c11 while no signal appears on the collector electrode c12 since transistor Q12 is nonconducting. Conversely, when a positive alternation of the amplified carrier frequency signal appears on the base electrode b12, an amplified output alternation is developd on the collector electrode c12 while transistor Q12 is rendered nonconductive. Thus, each other power transistor is alternately rendered conductive so that a 50 percent duty cycle is exhibited by each output transistor which results in a higher operating efficiency and a lower power consumption than heretofore exhibited by previous known track circuit transmitters. The amplified carrier waves are then modulated by the regulated sine wave signals fed to the center tap of the primary winding P so that an amplitude modulated carrier waveform MCW is inducted into the secondary winding S1 and may be suitably fed to one end of the track circuit section via a twisted pair of electrical conductors or the like.

As previously mentioned, an overload protection circuit including transistor Q6 senses the voltage across resistor R23 and limits the control voltage at the base electrode b2 to a safe level in the event of excessive output current due to a short circuit or overload condition. For example, when an overload condition occurs, an excessive amount of current will flow through resistor R23 and causes a voltage which exceeds the breakdown voltage level of Zener diode Z2. Accordingly, the transistor Q6 is rendered conductive so that the modulating signals SW are shunted to ground thereby limiting the modulated output across the output transformer T1. When the short circuit or overload condition disappears or is removed, the protection transistor Q6 is turned off and the modulated carrier frequency signal MCW is again developed across the output terminals of secondary winding S1.

It will be understood that while the invention finds particular utility in a broken rail detection system, it is readily evident that the sine wave modulated audio frequency transmitting circuit 1 may be employed in various other systems and apparatus which require the inherent vitality of this invention but regardless of how or where the invention is used, it will be appreciated that various changes may be made by persons skilled in the art without departing from the spirit and scope of the invention. It will also be apparent that other alterations, ramifications and modifications can be made in the presently described invention and, therefore, it is understood that all changes, equivalents and deviations within the spirit and scope of this invention are herein meant to be included in the appended claims.

Having now described the invention, what I claim as new and desire to secure by Letters Patent is:

1. A transmitter circuit for producing a sine wave modulated output signal comprising, a low frequency oscillator for developing a modulating signal, a high frequency oscillator for developing a carrier signal, said modulating signal coupled to the input of a switching regulator, said switching regulator including a multiple of transmitter control stages for alternately turning on and off an output stage whereby a time varying voltage is produced at the modulating frequency, a switching amplifier, said carrier signal coupled to the input of said switching amplifier, and the time varying voltage modulating output signal of said switching regulator coupled to said switching amplifier whereby the sine wave modulated output signal is developed across the output of said switching amplifier.

2. The transmitter circuit as defined in claim 1, wherein said output stage is a series pass output transistor stage.

3. The transmitter circuit as defined in claim 1, wherein said switching regulator includes an overload protection circuit which limits the modulating signal at the input of said switching regulator when an overload condition exists.

4. The transmitter circuit as defined in claim 1, wherein said switching regulator includes a first PNP transistor, a second NPN transistor, a third NPN transistor and a fourth PNP transistor for amplifying the modulating signal.

5. The transmitter circuit as defined in claim 3, wherein said overload protection circuit includes an NPN transistor which shunts the modulating signal from the input of said switching regulator.

6. The transmitter circuit as defined in claim 1, wherein said switching amplifier includes a push-pull transistor output stage.

7. The transmitter circuit as defined in claim 1, wherein said switching regulator includes a plurality of transistor stages.

8. The transmitter circuit as defined in claim 6, wherein said switching amplifier includes three cascaded transistor stages for driving one or said push-pull transistors and includes two cascaded transistor stages for driving the other of said push-pull transistors.

9. The transmitter circuit as defined in claim 1, wherein a transformer is coupled to the output of said switching amplifier.

10. The transmitter circuit as defined in claim 9, wherein a turned circuit including a capacitor and the primry winding of an output transformer is coupled to the secondary winding of said transformer which is coupled to the output of said switching amplifier.

11. The transmitter circuit as defined in claim 9, wherein a surge protection circuit is coupled to the primary winding of said transformer.

* * * * *